STABLE FREQUENCY-INDEPENDENT TWO-VALLEY SEMICONDUCTOR DEVICE

Filed Sept. 9, 1968

INVENTOR
H. W. THIM
BY
Roderick B. Anderson
ATTORNEY

United States Patent Office 3,537,021

Patented Oct. 27, 1970

3,537,021

STABLE FREQUENCY-INDEPENDENT TWO-VALLEY SEMICONDUCTOR DEVICE

Hartwig W. Thim, Summit, N.J., assignor to Bell Telephone Laboratories, Incorporated, Murray Hill and Berkeley Heights, N.J., a corporation of New York Filed Sept. 9, 1968, Ser. No. 758,405

Int. Cl. H03f 3/10

U.S. Cl. 330—5 8 Claims

ABSTRACT OF THE DISCLOSURE

A stable negative conductance diode comprises a wafer of two-valley semiconductor material with which a cathode or source contact forms a Schottky barrier. In order to give a frequency-independent negative conductance characteristic, the impurity density of the wafer is smaller than a certain value, which depends on the electron velocity-field ($v-E$) characteristic and on the barrier height; for gallium arsenide the product of impurity density $n_O$ and barrier height is less than about $3\times10^{13}$ cm.$^{-3}$ $V$.

BACKGROUND OF THE INVENTION

The patent of Gunn, 3,365,583, and a series of papers in the January 1966 issue of IEEE Transactions on Electron Devices, vol. ED–13, No. 1, describe how high frequency oscillations can be obtained by applying an appropriate direct current voltage across a suitable "two-valley" semiconductor sample of substantially homogeneous constituency. The applied field excites conduction band electrons from a low energy band valley to a higher energy band valley where they have a lower mobility. The lower mobility of the transferred electrons reduces the current through the wafer and gives rise to the formation of discrete regions of high electric field intensity and corresponding space-charge accumulation, called domains, that travel from the negative to the positive contact at approximately the carrier drift velocity. The domains are formed successively, and a new domain is formed only after the preceding one has been extinguished at the anode contact. The recurrent extinguishing of domains at the anode contact gives rise to an inherent pulsed output frequency related to the domain transit time in the wafer.

The Gunn-effect device is an unstable threshold device in that at low voltages it displays a positive conductance but at a threshold bias voltage it suddenly breaks into oscillations which can only be partially controlled by external circuitry. As such, it cannot be used for such purposes as amplification, switching, and memory storage without extensive external circuit modifications. In this respect it differs from stable negative resistance devices such as the tunnel diode.

Gunn-effect devices are usually made from gallium arsenide which must be doped to have a product of impurity density and wafer length which is greater than about $10^{12}$ cm.$^{-2}$ to provide enough electrons for the formation of domains. The copending application of Hakki-Thim-Uenohara, Ser. No. 632,102, filed Apr. 19, 1967 and assigned to Bell Telephone Laboratories, Incorporated, now Pat. No. 3,490,051, describes how a frequency regime of negative differential conductance can be established in gallium arsenide devices having an impurity density and sample length product below $10^{12}$ cm.$^{-2}$. While this device can be straightforwardly used as an amplifier, it is frequency dependent and does not have a D-C negative resistance characteristic.

If a two-valley device could be made with a stable frequency-independent negative resistance characteristic it is clear that it could be used for wideband amplification, for diode switching, and as a two-state memory storage element. While the well-known tunnel diode has such a desirable characteristic, it cannot be used at either very low or very high power levels.

SUMMARY OF THE INVENTION

I have found that by using a sufficiently low impurity density in the wafer, and a Schottky barrier cathode contact, a stable frequency-independent two-valley negative resistance diode can be realized. As will become clear hereinafter, the Schottky barrier inherently gives rise to a depletion layer within the wafer in which the carrier concentration is too small to permit the formation of either space-charge waves or traveling domains. Nevertheless, as long as the semiconductor is extrinsic, a negative resistance in the depletion layer can be obtained which is both stable and frequency-independent. In addition to being small enough to preclude the formation of domains, the impurity density should be sufficiently small that the differential positive resistance resulting from barrier lowering due to image forces does not compensate for the differential negative resistance resulting from two-valley electron transfer. These criteria will be discussed in detail hereinafter.

DRAWING DESCRIPTION

DETAILED DESCRIPTION

Figure 1:
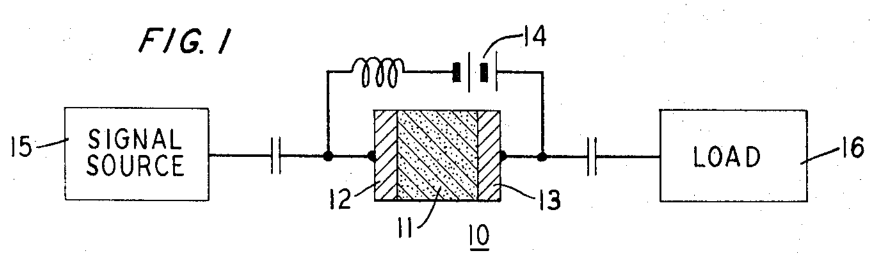
FIG. 1 is a schematic illustration of an illustrative embodiment of the invention.

Referring now to FIG. 1 there is shown a negative resistance diode 10 in accordance with the invention comprising a wafer 11 of two-valley semiconductor material, a Schottky barrier cathode or source contact 12 and an anode or collector contact 13 which may be an ohmic contact. The diode is reverse-biased by a battery 14. Signal wave energy to be amplified is transmitted from a source 15 through the diode 10 and thence to a load 16.

With the cathode contact 12 forming a Schottky barrier with the wafer, and with the wafer having suitable parameters as will be described below, the diode 10 displays a stable D-C negative resistance characteristic as shown by curve 17 of FIG. 2. That is, after the applied voltage across wafer 11 reaches a value $V_P$, the current through the diode falls with subsequent increases of voltage. For purposes of comparison, the current-voltage characteristic of a conventional Gunn-effect diode is shown by curves 18 and 18′ of FIG. 3. In the Gunn-effect diode, current increases with bias voltage as shown by curve 18 until the bias voltage reaches a threshold, at which time the current immediately drops to curve 18 due to the formation of a high field domain. In the usual case, the operating point then oscillates between curves 18 and 18′ due to the periodic extinguishing and forming of domains. Because of this instability, it cannot ordinarily be used as an amplifier, a switch, or a storage element.

Figure 2:
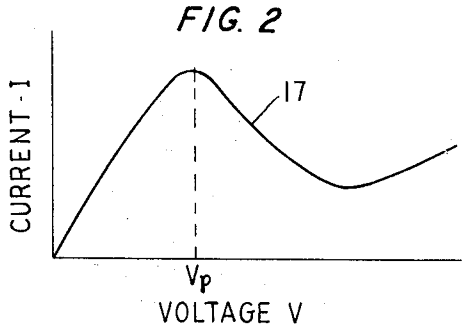
FIG. 2 is a graph of the current-voltage characteristic in the two-valley semiconductor diode of FIG. 1.
Figure 3:
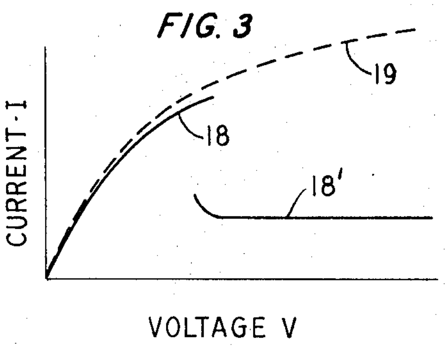
FIG. 3 is a graph of current-voltage characteristics of two-valley semiconductor diodes of the prior art which is included for purposes of comparison.

It is obvious from FIG. 2 that diode 11 can easily be switched from one positive to another positive or to a negative resistance state simply by pulsing the bias voltage. Curve 19 of FIG. 3 illustrates the current-voltage characteristic of a subcritically doped amplifier of the type disclosed in the aforementioned Hakki et al. application; it displays no negative resistance at all with respect to applied D-C voltage and current and gives a negative resistance only with respect to A-C voltages within specified frequency bands.

Figures 4, 5, 6:
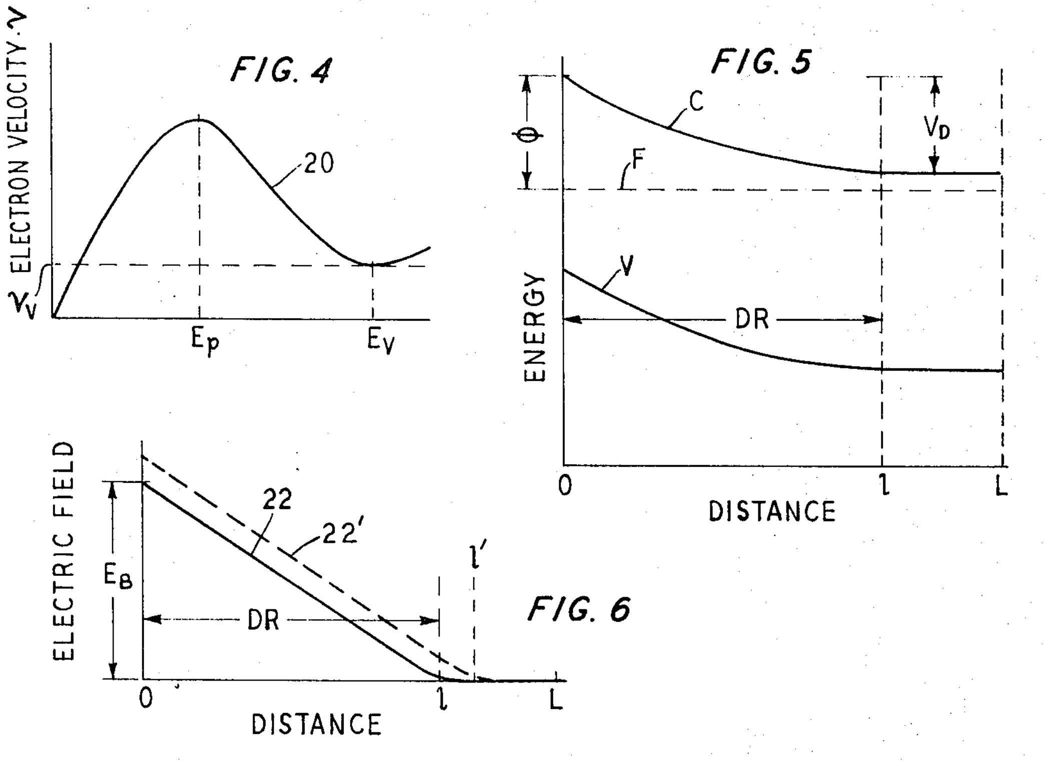
FIG. 4 is a graph of the electron velocity versus electric field of the diode of FIG. 1.
FIG. 5 is a graph of energy versus distance in the diode of FIG. 1.
FIG. 6 is a graph of electric field versus distance in the diode of FIG. 1.

The curve 17 of FIG. 2 should not be confused with the electron velocity versus electric field characteristic shown by curve 20 of FIG. 4 which is common to all two-valley semiconductors. That is, when the localized electric field within a semiconductor of this type reaches a value $E_P$, a further increase of the electric field results in a reduction of the net electron velocity $v$ due to the lower mobility of transferred electrons. This increase gives rise to a differential negative resistance which is illustrated by the negative slope portion of curve 20.

The reason that my Schottky barrier diode 10 is capable of displaying the D-C negative resistance characteristic shown in FIG. 2, while other two-valley semiconductor devices do not, can be explained rigorously through a detailed mathematical development, but for the sake of brevity this analysis will not be given. Basically, this characteristic is realized because the Schottky barrier forms a substantial depletion layer across the wafer through which extends an inherent electric field even in the absence of a bias voltage. The bias voltage applied to the contacts increases this internal electric field until, at the applied voltage $V_p$ of FIG. 2, most of the electrons are excited to the low mobility upper energy state. However, the carrier concentration in the depletion region is too small to permit the substantial internal space-charge accumulation required for either domain or space-charge wave formation, and further increases in the bias voltage merely increase the proportion of the electrons excited to the lower mobility energy state. Hence, just as the electron velocity falls with increasing electric field as shown by FIG. 4, the current falls uniformly with increasing voltage as shown in FIG. 2.

The establishment of a Schottky barrier between cathode contact 12 and wafer 11 of FIG. 1 is illustrated in the energy band diagram of FIG. 5 in which C, F, and V respectively designate the lower boundary of the conduction band, the Fermi level and the upper boundary of the valence band. With the contact being formed in a known manner to give a good Schottky barrier—that is, with clean and uniform contiguous faces of the metal and semiconductor—the conduction and valence bands will bend upwardly as shown, to be approximately equidistant from the Fermi level at the metal-semiconductor interface. This results in a depletion region DR of length $l$ in which most of the free electrons are depleted from the conduction band of the wafer. The energy separation $\varphi$ between the Fermi level and the conduction band at the interface is a measure of the height of the Schottky barrier.

The establishment of the depletion region gives rise to an inherent electric field due to ionized impurities as shown by curve 22 of FIG. 6. The application of a bias voltage of course increases the electric field as shown by curve 22' and lengthens the depletion region to length $l'$. The majority carrier density $n_B$, which in an n-type material would be the free electron density, is shown by curve 23 of FIG. 7, and the impurity density $n_O$ is shown by curve 24. In the absence of the Schottky barrier, the majority carrier density would be equal to the impurity density, but within the depletion region, $n_B$ is smaller than $n_O$.

With the foregoing in mind, the conditions for a frequency-independent negative resistance in accordance with the invention may be stated as follows:

(1) A semiconductor wafer having the differential negative resistance characteristic shown in FIG. 4 must be used; e.g., a two-valley semiconductor must be used.

Figure 7:
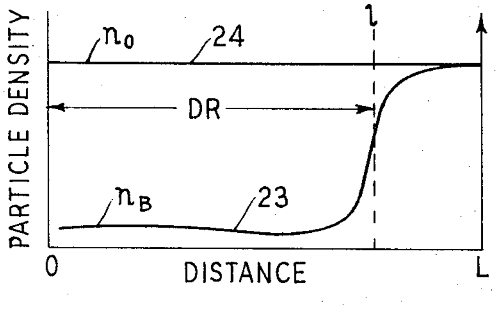
FIG. 7 is a graph of particle density versus distance in the diode of FIG. 1.

(2) A depletion region must be formed within the wafer to prevent the accumulation of space-charge. With reference to FIG. 7, depletion may be deemed to occur when $$n_B < n_O \tag{1}$$

Or alternatively, when a rectifying barrier is used to form the depletion region, the energy bands C and V must bend upwardly at the barrier as shown in FIG. 5. The energy difference $V_D$ between the conduction band C at the barrier and outside the depletion region is then greater than zero, or $$V_D > 0 \tag{2}$$

where $V_D$ is known as the diffusion potential. With a non-rectifying or ohmic contact, the bands C and V bend downwardly and $V_D$ is a negative quantity.

(3) Electrons, or more precisely, majority carriers, must be injected into the depletion region at a velocity $v_{inj}$ sufficient to permit differential negative resistance, or $$v_{inj} > v_v \tag{3}$$

where $v_v$ is illustrated in FIG. 4. This condition is inherently met by a reasonably good Schottky barrier, but it precludes depletion formation by a metal-oxide-semiconductor contact unless electrons of sufficient velocity are permitted to tunnel through the oxide layer. It also limits the use of certain p-n-n contacts. Alternatively, carriers can be injected by shining light of a proper frequency $\nu$ (i.e., $h\nu \geq E_G$, $E_G$=band gap energy) onto the Schottky barrier-metal contact, which in this case must be sufficiently thin to be partially transparent. Carriers can also be injected by bombarding the metal contact with electrons of sufficiently high energy.

(4) The carrier density $n_B$ should be substantially independent of the electric field $E_B$ across the depletion region, or decrease with increasing $E_B$. This may be stated as $$\frac{dn_B}{dE_B} < \frac{n_B}{v}\left|\frac{dv}{dE_B}\right| \tag{4}$$

where $d$ designates the derivative and electron velocity is a function of $E_B$. This condition is included because, when a Schottky barrier contact is used, a positive differential conductance may result from electron image forces. As known in Schottky barrier theory, image forces are caused by positive charges induced on the metal contact by wafer electrons, which lowers the barrier height, thereby reducing the extent of electron depletion in the wafer.

In the context of a Schottky barrier diode, condition (4) may be more conveniently stated as, $$-\frac{dv}{dE_B}\frac{1}{v} > \frac{q}{4kT}\sqrt{\frac{q}{\pi\epsilon_i E_B}} \tag{5}$$

where $q$ is the charge on a majority carrier and $\epsilon_i$ is the image force permitivity. The left side of the equation is a measure of negative resistance resulting from electron transfer and the right side is a measure of positive resistance due to image forces. With regard to condition (3), the injection velocity across a Schottky barrier can be expressed as $$v_{inj} = \sqrt{\frac{3kT}{6\pi m_{eff}}} \tag{6}$$

where $k$ is Botzmann's constant, T is temperature and $m_{eff}$ is the effective mass of a majority carrier in the semiconductor.

While bare compliance with the above conditions will give some negative resistance in accordance with the invention, optimum operation requires parameters well within the limits described. For example, for the electric field $E_B$ of FIG. 6 to be limited to the depletion region DR as shown, the Schottky barrier should be of sufficient quality and the impurity density should be sufficiently small that, $$\frac{n_B}{n_O} < \frac{1}{10} \quad (7)$$

This will insure against frequency sensitivity due to "sub-critically doped" operation as in the aforementioned Hakki et al. device.

To give a D-C negative resistance, that is, a negative resistance to all applied voltages of the proper polarity, the diode should be biased such that the electric field at the cathode $E_B$ is equal to the electric field $E_P$ of FIG. 4 at which differential negative resistance commences, or, $$E_B \approx E_P \quad (8)$$

which may alternatively be stated as, $$E_B \approx \sqrt{\frac{2qn_O V_D}{\epsilon}} \quad (9)$$

where $n_O$ is the impurity density of the wafer and $\epsilon$ the dielectric constant in the wafer.

For gallium arsenide, this leads to $$n_O V_D \cong n_O \varphi \; 3 \times 10^{13} V \cdot \text{cm.}^{-3} \quad (10)$$

Since only the depletion region gives a negative resistance, the wafer length L is preferably no longer than the length $l$ of the depletion region or $$L \lesseqgtr l \quad (11)$$

In summary, it can be seen that the diode described, which can be considered a "depletion-mode" diode to distinguish it from other bulk-effect or two-valley diodes that are free of depletion regions, may be designed to have a stable current-voltage curve as shown in FIG. 2 that corresponds to the velocity-field curve inherent in two-valley semiconductors shown in FIG. 4. Minimum conditions for obtaining a stable negative resistance as well as optimum conditions for a Schottky barrier diode have been presented. While the illustrative embodiment shows a stable, frequency-insensitive amplifier, it is to be understood that the device can be used for a number of other purposes, notably as a memory storage element and as a high-speed switch. Various other embodiments and modifications may be made by those skilled in the art without departing from the spirit and scope of the invention.

What is claimed is:

1. A negative resistance device comprising:
a semiconductor wafer having a differential negative resistance characteristic with respect to majority carriers having a velocity greater than a minimum velocity $v_V$;
means for forming a depletion region within the wafer;
the impurity density within the wafer being sufficiently small that the majority carrier density $n_B$ within the depletion region does not increase with increasing electric field $E_B$;
and means for injecting majority carriers into the depletion region at a velocity $v_{inj}$ greater than said minimum velocity $v_V$.

2. The negative resistance device of claim 1 wherein the depletion region producing means comprises a Schottky barrier contact;
and the parameters of the diode comply with the relation $$\frac{dn_B}{dE_B} < \frac{n_B}{v}\left|\frac{dv}{dE_B}\right|$$

where $v$ is majority carrier velocity in the wafer.

3. The negative resistance device of claim 2 wherein:

$$-\frac{dv}{dE_B}\frac{1}{v} > \frac{q}{4kT}\sqrt{\frac{q}{\pi\epsilon_i E_B}}$$

where $q$ is the charge on a majority carrier, $k$ is Botzmann's constant, T is the temperature of the wafer and $\epsilon_i$ is the image force permittivity.

4. The negative resistance device of claim 3 wherein:

$$\frac{n_B}{n_O} < \frac{1}{10}$$

where $n_O$ is the impurity density in the depletion region.

5. The negative resistance device of claim 4 wherein:
the wafer is characterized by a minimum electric field value $E_P$ at which differential negative resistance may occur; and further comprising:
means for applying across the depletion region an electric field with a maximum value $E_B$ which is approximately equal to $E_P$.

6. The negative resistance device of claim 5 wherein:
the wafer substantially complies with the relation $$L \lesseqgtr l$$

where L is the length of the wafer between the source and collector contacts and $l$ is the length of the depletion region.

7. The negative resistance device of claim 6 wherein:
the wafer is n-type gallium arsenide which complies with the relation $$n_O \varphi \lesseqgtr 3 \times 10^{13} V/\text{cm.}^3$$

where $\varphi$ is the barrier height of the Schottky barrier.

8. An amplifier for amplifying high frequency energy from a signal source prior to utilization by a load comprising:
a negative resistance diode comprising a wafer of n-type two-valley semiconductor material contained between a cathode contact and an anode contact;
said cathode contact forming a Schottky barrier with the wafer;
said cathode contact being coupled to the source;
said anode contact being coupled to the load;
and means comprising the Schottky barrier and a bias source connected between the anode and cathode contacts for forming a depletion region within the wafer.

References Cited

UNITED STATES PATENTS

| | | | |
|---|---|---|---|
| 3,439,290 | 4/1969 | Shinoda | 317—234 |
| 3,461,356 | 8/1969 | Yamashita et al. | 317—234 |

ROY LAKE, Primary Examiner

D. R. HOSTETTER, Assistant Examiner

U.S. Cl. X.R.

330—34; 317—234; 307—317